(12) United States Patent
Boday et al.

(10) Patent No.: US 10,968,320 B2
(45) Date of Patent: *Apr. 6, 2021

(54) THERMAL INTERFACE MATERIALS INCLUDING POLYMERIC PHASE-CHANGE MATERIALS

(71) Applicant: International Business Machines Corporation, Armonk, NY (US)

(72) Inventors: Dylan J. Boday, Tucson, AZ (US); Joseph Kuczynski, North Port, FL (US); Timothy C. Mauldin, San Diego, CA (US)

(73) Assignee: International Business Machines Corporation, Armonk, NY (US)

( * ) Notice: Subject to any disclaimer, the term of this patent is extended or adjusted under 35 U.S.C. 154(b) by 100 days.

This patent is subject to a terminal disclaimer.

(21) Appl. No.: 16/238,735

(22) Filed: Jan. 3, 2019

(65) Prior Publication Data

US 2019/0135987 A1 May 9, 2019

Related U.S. Application Data

(62) Division of application No. 14/954,409, filed on Nov. 30, 2015, now Pat. No. 10,316,151.

(51) Int. Cl.
| | |
|---|---|
| *C09K 5/00* | (2006.01) |
| *C08G 81/02* | (2006.01) |
| *H01L 23/373* | (2006.01) |
| *H01L 23/427* | (2006.01) |
| *C08F 299/04* | (2006.01) |
| *C08G 63/676* | (2006.01) |
| *H01L 23/00* | (2006.01) |
| *C08G 65/332* | (2006.01) |
| *C09K 5/02* | (2006.01) |
| *C09K 5/06* | (2006.01) |

(52) U.S. Cl.
CPC ...... *C08G 81/021* (2013.01); *C08F 299/0485* (2013.01); *C08G 63/676* (2013.01); *C08G 65/3322* (2013.01); *C09K 5/00* (2013.01); *C09K 5/02* (2013.01); *C09K 5/06* (2013.01); *H01L 23/3737* (2013.01); *H01L 23/4275* (2013.01); *H01L 24/29* (2013.01); *H01L 24/32* (2013.01); *H01L 24/83* (2013.01); *H01L 2224/2919* (2013.01); *H01L 2224/83201* (2013.01)

(58) Field of Classification Search
CPC .......... C08G 81/021; C09K 5/00; C09K 5/02; C09K 5/06
USPC .......................................... 252/71
See application file for complete search history.

(56) References Cited

U.S. PATENT DOCUMENTS

| | | |
|---|---|---|
| 7,816,785 B2 | 10/2010 | Iruvanti et al. |
| 8,587,945 B1 | 11/2013 | Hartmann et al. |

(Continued)

FOREIGN PATENT DOCUMENTS

TW 201418443 A 5/2014

OTHER PUBLICATIONS

Mauldin, et al., "Block Copolymers Derived from the Acyclic Diene Metathesis (ADM ET) Polymerization of a Modified Vegetable Oil", American Chemical Society, 2011, 2 pp.

(Continued)

*Primary Examiner* — Jane L Stanley
(74) *Attorney, Agent, or Firm* — Patterson + Sheridan, LLP

(57) ABSTRACT

In an example, a thermal interface material includes a polymeric phase-change material.

18 Claims, 3 Drawing Sheets

Polymeric Phase-Change Material
(Thermal Interface Material)

(56) References Cited

U.S. PATENT DOCUMENTS

| | | | |
|---|---|---|---|
| 2005/0233145 A1* | 10/2005 | Abe | C09K 5/063 428/375 |
| 2006/0235151 A1* | 10/2006 | Lin | C08G 65/332 525/107 |
| 2010/0264353 A1* | 10/2010 | Hartmann | C08F 220/18 252/62 |
| 2014/0043754 A1 | 2/2014 | Hartmann et al. | |
| 2014/0221575 A1 | 8/2014 | Hartmann et al. | |
| 2014/0262192 A1 | 9/2014 | Boday et al. | |
| 2015/0176915 A1 | 6/2015 | Krishnan et al. | |
| 2015/0203733 A1* | 7/2015 | Zhang | C08F 222/20 522/39 |
| 2016/0223269 A1 | 8/2016 | Hartmann et al. | |
| 2017/0152351 A1 | 6/2017 | Boday et al. | |

OTHER PUBLICATIONS

Carboxyl Protecting Groups Stability, "Organic Chemistry Portal Reactions Protecting Groups Stability," [Accessed Online Dec. 14, 2018] https://www.organic-chemistry.org/protectivegroups/carboxyl.shtm.

Laboratory of Biocatalysis & Bioprocessing—RPI, "Elucidation of cutinase structure-activity relationships," [Accessed Online Dec. 14, 2018] http://homepages.rpi.edu/~gross/research/research009.htm.

IBM, "List of IBM Patents or Patent Applications Treated as Related," for U.S. Appl. No. 16/238,735, titled "Thermal Interface Materials Including Polymeric Phase-Change Materials," as filed on Jan. 3, 2019.

IBM, "List of IBM Patents or Patent Applications Treated as Related," for U.S. Appl. No. 16/238,735, titled "Thermal Interface Materials Including Polymeric Phase-Change Materials," as filed on Jan. 3, 2019, 2 Pages.

U.S. Appl. No. 16/404,269 "Thermal Interface Materials Including Polymeric Phase-Change Materials," as filed on May 6, 2019.

* cited by examiner

THERMAL INTERFACE MATERIALS INCLUDING POLYMERIC PHASE-CHANGE MATERIALS

I. CROSS-REFERENCE TO RELATED APPLICATIONS

This application is a divisional of co-pending U.S. patent application Ser. No. 14/954,409, filed Nov. 30, 2015. The aforementioned related patent application is herein incorporated by reference in its entirety.

II. FIELD OF THE DISCLOSURE

The present disclosure relates generally to thermal interface materials including polymeric phase-change materials.

III. BACKGROUND

In modern computers, large amounts of heat are generated within the central processing units (CPUs) which must be removed in order to maximize speed and reliability, to extend product life, and to prevent spontaneous failure due to overheating. Heat may be removed from CPUs by attaching an air-cooled heat sink or a liquid-cooled cold plate to the top of the processor die, with a thermal interface material (TIM) placed between the chip die and cooling apparatus to reduce the large thermal contact resistance that can occur at bare solid-solid surface contacts. Although the use of TIMs is closely associated with electronics thermal management, TIMs may also be used in other engineering or industrial application for which minimizing the thermal interface resistance between surfaces is desirable.

While some thermal interface materials may be able to reduce the thermal contact resistance as compared to bare surfaces, the thermal resistance of the TIM itself may be a significant contributor to the total thermal resistance between the chip and the cooling environment, thereby limiting the amount of heat which can be effectively removed from the processor while maintaining the temperature within an acceptable range of values. The limit on the amount of heat that can be removed may limit the power and processing capabilities of the CPU. In some cases, grease-like or paste-like TIMs contain volatile compounds which degrade or can be lost after long-term exposure to the elevated temperatures associated with electronics thermal management. Such mass loss and other types of TIM "pump out" may leave air voids between the processor and the cooling apparatus, resulting in the creation of localized regions of elevated temperature on the processor chip which may lead to premature failure.

IV. SUMMARY OF THE DISCLOSURE

According to an embodiment, a thermal interface material is disclosed that includes a polymeric phase-change material.

According to another embodiment, a process of forming a thermal interface material is disclosed. The process includes forming a mixture that includes a vinyl-terminated fatty acid monomer having a chemical formula $C_2H_4$—R—$C(O)OH$ and an ethylene glycol monomer having a chemical formula $C_{2n}H_{4n+2}O_{n+1}$. The process also includes polymerizing the mixture to form a diene and polymerizing the diene to form a polymeric phase-change material. The process further includes forming a thermal interface material that includes the polymeric phase-change material.

According to another embodiment, an article of manufacture is disclosed. The article of manufacture includes a first component, a second component, and a thermal interface material. The thermal interface material is disposed between the first component and the second component and includes a polymeric phase-change material.

One advantage of the present disclosure is the ability to form a thermal interface material between a heat source and a heat sink that includes a polymeric phase-change material. Another advantage of the present disclosure is the ability to form a thermal interface material having acceptable material properties in a temperature range associated with electronics thermal management.

Features and other benefits that characterize embodiments are set forth in the claims annexed hereto and forming a further part hereof. However, for a better understanding of the embodiments, and of the advantages and objectives attained through their use, reference should be made to the Drawings and to the accompanying descriptive matter.

V. BRIEF DESCRIPTION OF THE DRAWINGS

VI. DETAILED DESCRIPTION

The present disclosure describes thermal interface materials that include polymeric phase-change materials (i.e., where the polymer itself it a phase change material, not a phase-change material that is blended with the polymer). Other phase change materials that may be used in electronic applications may be composed of waxes and may suffer from poor thermal resistance. That is, the thermal resistance increases with increasing thermal cycles, thereby degrading performance. For example, while such phase change materials may appear to provide the possibility of improving TIM performance, such phase change materials may have poor thermal stability at relatively moderate temperature (e.g., >70° C.). Metallic TIMs, such as those based on patterned indium, may not be prone to mass loss but may be prohibitively expensive for many applications or unavailable in the future due to a limited raw material supply and increasing demand for use in other areas of technology.

In the present disclosure, thermal interface materials that include polymeric phase-change materials as described herein may provide high thermal transport properties, may demonstrate long-term stability within the operational temperature range of electronics, and may be composed of materials that are abundant and cost-effective. The polymeric materials of the present disclosure may have a melting temperature and heat of fusion comparable to that of phase change materials based on paraffin or fatty acids yet possessing sufficient thermal stability.

The polymeric phase-change materials of the present disclosure may have a suitably high melting enthalpy to be comparable with wax materials and salt-based phase-change materials and a melting temperature in a temperature range appropriate for a desired application (e.g., in a range of 0° C. to 100° C., where TIM phase-change materials may be at the higher end of this range, while insulating materials may be at the lower end of this range). Further, in order to overcome the shortcomings of wax/metallic TIMs described above, the polymeric phase-change materials of the present disclosure may have a high thermal stability consistent with what is commonly observed for polymers but uncommon for waxes and sufficient mechanical integrity typically absent in waxes which aids in the incorporation of the polymeric phase-change materials in structural applications.

Figure 1:
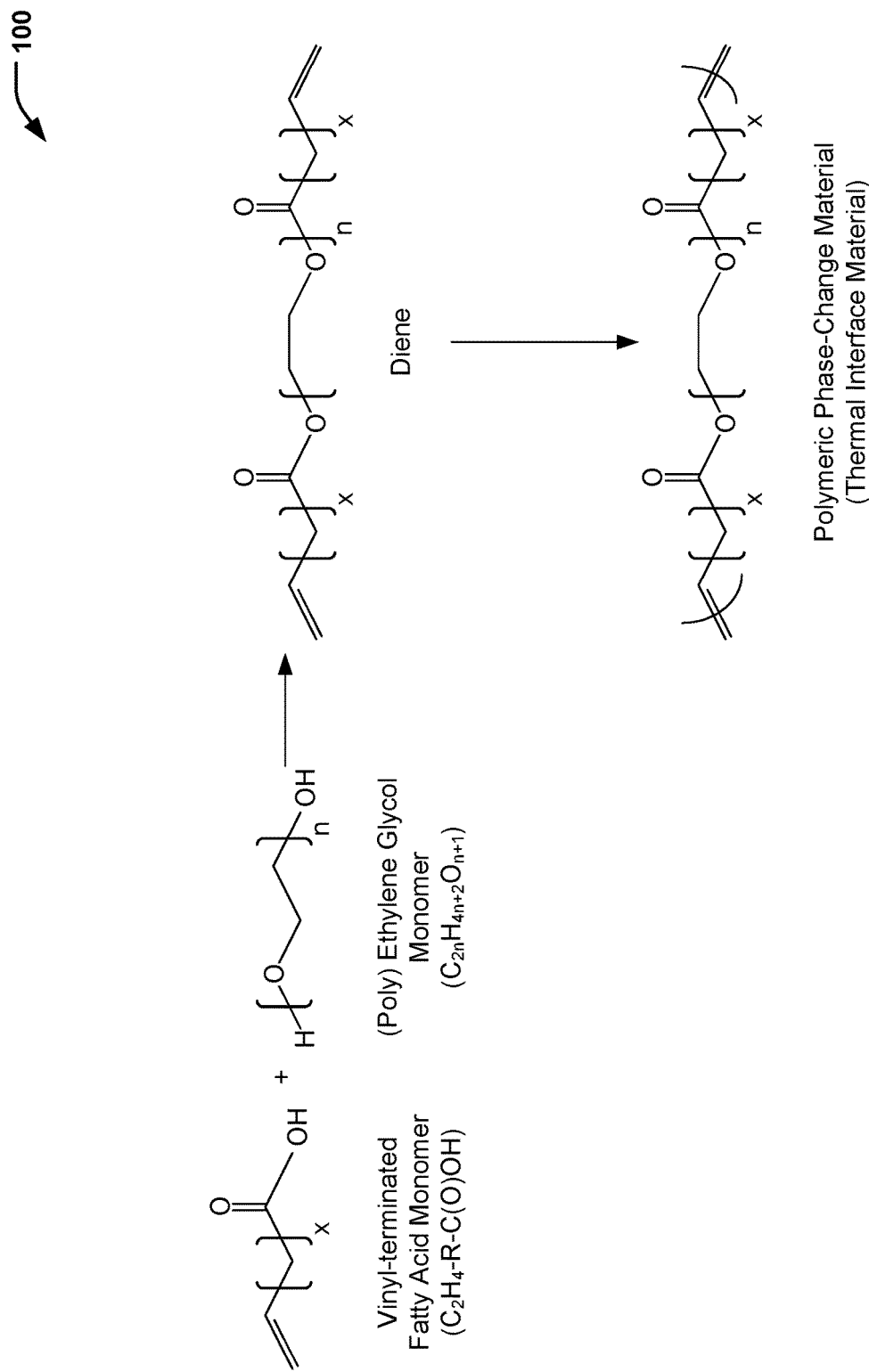
FIG. 1 is a chemical reaction diagram showing the preparation of a polymeric phase-change material for use as a thermal interface material, according to one embodiment.

Referring to FIG. 1, a chemical reaction diagram 100 illustrates the preparation of a polymeric phase-change material for use as a thermal interface material, according to one embodiment. FIG. 1 illustrates that a vinyl-terminated fatty acid monomer and an ethylene glycol monomer may be polymerized to form a diene, and the diene may be polymerized to form a polymeric phase-change material. As described further herein with respect to FIG. 2, the polymeric phase-change material formed according to the process illustrated in FIG. 1 may be used to form a thermal interface material having acceptable material properties for a particular thermal management application, such as electronics thermal management.

FIG. 1 illustrates an example of a process of forming a thermal interface material including a polymeric phase-change material. The process includes forming a mixture that includes a vinyl-terminated fatty acid monomer having a chemical formula $C_2H_4$—R—C(O)OH and an ethylene glycol monomer having a chemical formula $C_{2n}H_{4n+2}O_{n+1}$. In FIG. 1, the chain length of the alkyl group (R) between a terminal vinyl group and a carbonyl group of the vinyl-terminated fatty acid monomer is represented by a first integer value x. Further, a second integer value n indicates that the ethylene glycol monomer may include ethylene glycol (where n=1) or a polyethylene glycol (where n≥2).

The first chemical reaction of FIG. 1 illustrates that the mixture may be polymerized to form a diene (e.g., via an acyclic metathesis (ADMET) polymerization reaction). As described further herein, material properties of the polymeric phase-change material (e.g., melting temperature, melting enthalpy, etc.) formed from the diene may be "tailored" to a particular thermal management environment (e.g., for electronic device thermal management) by adjusting a first portion of the diene corresponding to the vinyl-terminated fatty acid monomer (represented by the integer x in FIG. 1) and a second portion of the diene corresponding to the ethylene glycol monomer (represented by the integer n in FIG. 1).

The second chemical reaction of FIG. 1 illustrates that the diene may be polymerized (e.g., via an ADMET polymerization reaction) to form a polymeric phase-change material. As described further herein with respect to FIG. 2, a thermal interface material may be formed by disposing the polymeric phase-change material (e.g., in the form of a polymeric sheet) between a first component (e.g., a heat source, such as a semiconductor die) and a second component (e.g., a heat sink). In some cases, the polymeric sheet (including the polymeric phase-change material) may have a first thickness value (e.g., in a range of 8 mm to 20 mm). Application of pressure to the polymeric sheet may reduce the first thickness value to a second thickness value (e.g., about 1 mm). The polymeric phase-change material may melt and conform to the mating surfaces (e.g., a surface of the heat source and a surface of the heat sink).

In a particular embodiment, the vinyl-terminated fatty acid monomer illustrated in FIG. 1 may be formed from a bio-renewable material. To illustrate, in the case of castor oil, the chain length of the alkyl group (R) between a terminal vinyl group and a carbonyl group of the vinyl-terminated fatty acid monomer (represented by the integer x) may be 8 carbon atoms. In some cases, a particular vinyl-terminated fatty acid monomer (or combination of monomers) having a particular alkyl chain length (e.g., ≥8 carbon atoms) may be selected in order to "tailor" the material properties of the polymeric phase-change material by adjusting a contribution of the vinyl-terminated fatty acid monomer to an overall chain length of the diene.

In some cases, the ethylene glycol monomer includes ethylene glycol (where n=1). In other cases, the ethylene glycol monomer may include a polyethylene glycol (where n≥2), such as tetraethylene glycol (where n=4), among other alternatives. In some cases, a particular ethylene glycol monomer (or combination of monomers) having a particular number of repeating $CH_2$—$CH_2$—O groups (e.g., ≥1 repeating units) may be selected in order to "tailor" the material properties of the polymeric phase-change material by adjusting a contribution of the ethylene glycol monomer to an overall chain length of the diene.

In some cases, the material properties of the polymeric phase-change material may be "tailored" to a particular thermal management environment (e.g., electronic device thermal management) by adjusting a combination of the contribution of the vinyl-terminated fatty acid monomer and the contribution of the ethylene glycol monomer to an overall chain length of the diene. As illustrative, non-limiting examples, acceptable material properties for a thermal interface material disposed between a heat source such as a semiconductor die and a heat sink may include a melting transition temperature ($T_m$) in a range of 0° C. to 100° C., a melting enthalpy in a range of 200 J/g to 400 J/g, and a thermal stability parameter ($T_d$) of 5% mass loss (or less) at a temperature that is in a range of 250° C. to 450° C.

EXAMPLE 1

A first portion of the overall chain length of the diene corresponding to the vinyl-terminated fatty acid monomer is 16 (where x=8) and a second portion of the overall chain length of the diene corresponding to the ethylene glycol monomer is 1 (where n=1). The polymeric phase-change material formed via polymerization of such a diene has a thermal stability parameter ($T_d$) of 5% mass loss at 390° C., a melting transition temperature ($T_m$) of 58° C., and a melting enthalpy of 350 J/g.

EXAMPLE 2

A first portion of the overall chain length of the diene corresponding to the vinyl-terminated fatty acid monomer is 16 (where x=8) and a second portion of the overall chain length of the diene corresponding to the ethylene glycol monomer is 4 (where n=4). The polymeric phase-change material formed via polymerization of such a diene has a thermal stability parameter ($T_d$) of 5% mass loss at 300° C., a melting transition temperature ($T_m$) of 45° C., and a melting enthalpy of 240 J/g.

Thus, FIG. 1 illustrates an example of a process of preparing a polymeric phase-change material for use as a thermal interface material. As illustrated and further described herein with respect to FIG. 2, the polymeric phase-change material formed according to the process illustrated in FIG. 1 may be used to form a thermal interface material disposed between a first component (e.g., a heat source, such as a semiconductor die) of an article of manufacture (e.g., an electronic device) and a second component (e.g., a heat sink) of the article of manufacture.

Figure 2:
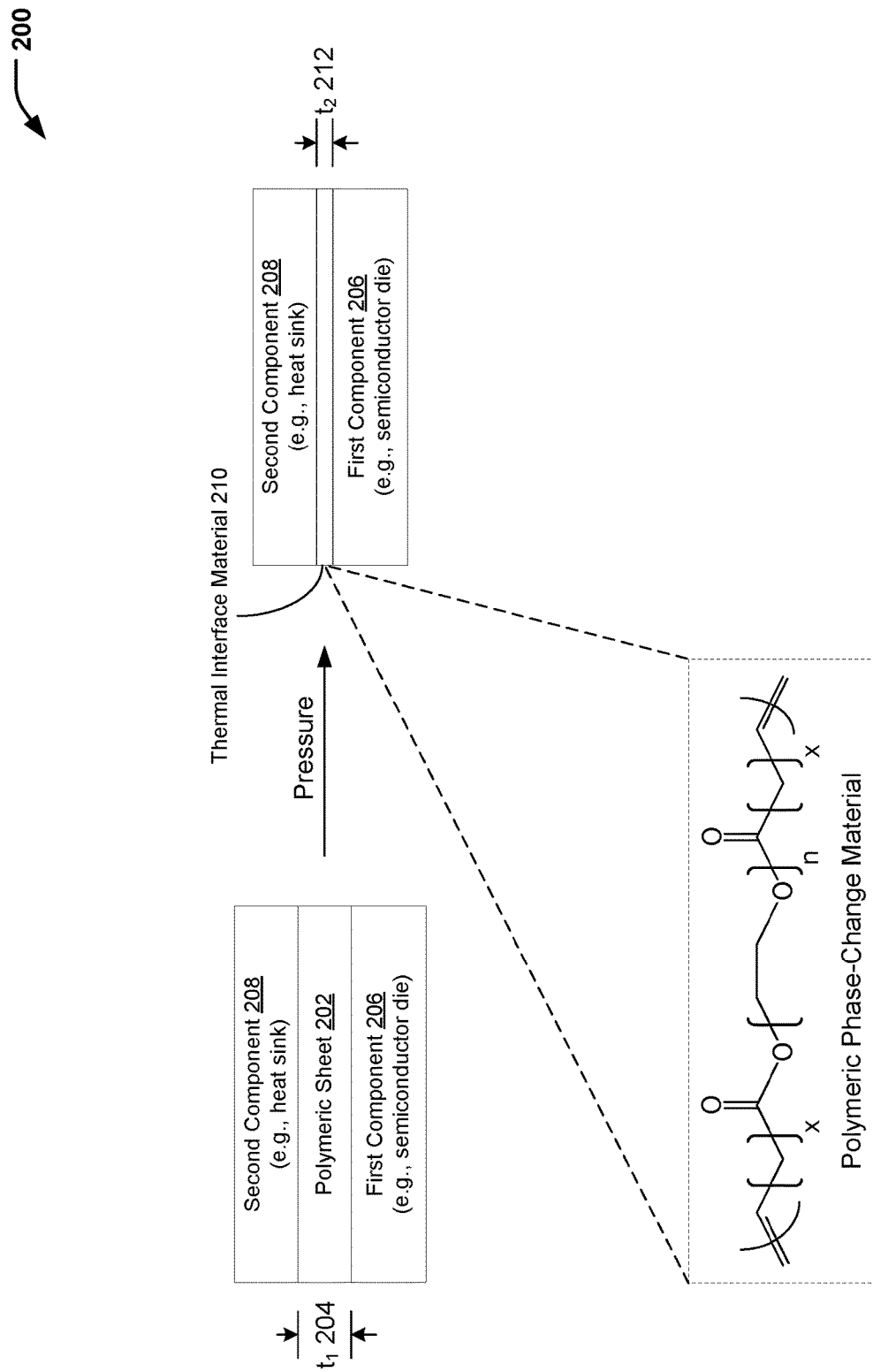
FIG. 2 is a diagram showing the preparation of a thermal interface material that includes a polymeric phase-change material.

Referring to FIG. 2, a diagram 200 illustrates the formation of a thermal interface material that includes a polymeric phase-change material. In FIG. 2, the polymeric phase-change material illustrated in FIG. 1 (e.g., in the form of a polymeric sheet) may be disposed between two components, and pressure may be applied to form an article of manufacture having a thermal interface material that includes the polymeric phase-change material between the two components.

In the example of FIG. 2, the polymeric phase-change material of FIG. 1 may be in the form of a polymeric sheet 202 having a first thickness value 204 (identified as "$t_1$" in FIG. 1). The polymeric sheet 202 may be disposed between a first component 206 (e.g., a semiconductor die) and a second component 208 (e.g., a heat sink), and pressure may be applied to form a thermal interface material 210 having a second thickness value 212 (identified as "$t_2$" in FIG. 2) that is less than the first thickness value 204. In a particular embodiment, the first thickness value 204 (prior to application of pressure to the polymeric sheet 202) may be in a range of 8 millimeters to 20 millimeters. The polymeric phase-change material may melt and conform to a first surface (associated with the first component 206) and a second surface (associated with the second component 208). In a particular embodiment, the second thickness value 212 associated with the thermal interface material 210 may be reduced to about 1 millimeters.

In a particular embodiment, the thermal interface material 210 that includes the polymeric phase-change material may have a melting transition temperature ($T_m$) in a range of 0° C. to 100° C., a melting enthalpy in a range of 200 J/g to 400 J/g, and a thermal stability parameter ($T_d$) of 5% mass loss at a temperature that is in a range of 250° C. to 450° C. As an example, the polymeric phase-change material may have a thermal stability parameter ($T_d$) of 5% mass loss at 390° C., a melting transition temperature ($T_m$) of 58° C., and a melting enthalpy of 350 J/g. As another example, the polymeric phase-change material may have a thermal stability parameter ($T_d$) of 5% mass loss at 300° C., a melting transition temperature ($T_m$) of 45° C., and a melting enthalpy of 240 J/g.

Thus, FIG. 2 illustrates an example of a process of forming a thermal interface material that includes a polymeric phase-change material. In the particular embodiment illustrated in FIG. 2, the polymeric phase-change material formed according to the process described herein with respect to FIG. 1 may be formed into a polymeric sheet and disposed between two components (e.g., of an electronic device). The polymeric phase-change material may melt and conform to the surfaces of the components. The thermal interface material having the polymeric phase-change material may provide acceptable material properties at elevated temperatures associated with electronics thermal management.

Figure 3:
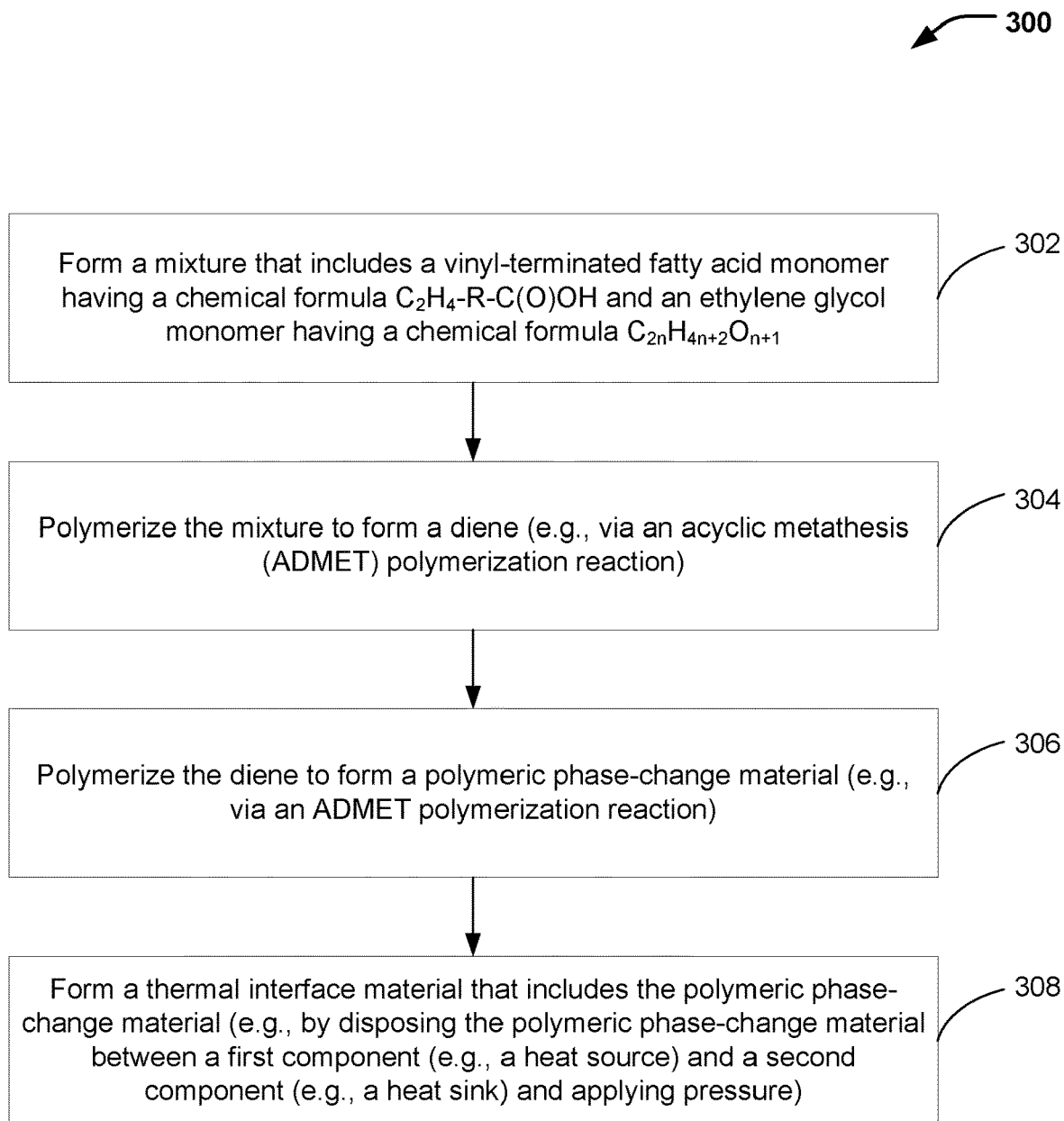
FIG. 3 is a flow diagram showing a particular embodiment of a process of forming a thermal interface material that includes a polymeric phase-change material.

Referring to FIG. 3, a flow diagram illustrates a particular embodiment of a process 300 of forming a thermal interface material that includes a polymeric phase-change material. In the example of FIG. 3, the process 300 further includes disposing the thermal interface material between a first component (e.g., a heat source) of an article of manufacture and a second component (e.g., a heat sink) of the article of manufacture.

In the particular embodiment illustrated in FIG. 3, operations associated with an example process of forming a polymeric phase-change material are identified as operations 302-306, while operations associated with forming a thermal interface material that includes the polymeric phase-change material are illustrated as operation 308. It will be appreciated that the operations shown in FIG. 3 are for illustrative purposes only and that the operations may be performed at alternative times, by a single entity or by multiple entities, or a combination thereof. As an example, one entity (e.g., a specialty chemical manufacturer) may produce the diene, another entity may produce the polymeric phase-change material, while another entity may form a polymeric sheet that includes the polymeric phase-change material. Further, alternative or additional entities (e.g., an electronic device manufacturer) may form the thermal interface material that includes the polymeric phase-change material by disposing the polymeric sheet between a first component (e.g., a heat source) and a second component (e.g., a heat sink) and applying pressure. The polymer may melt and conform to the component surfaces.

The process 300 includes forming a mixture that includes a vinyl-terminated fatty acid monomer and an ethylene glycol monomer, at 302. The vinyl-terminated fatty acid monomer has a chemical formula $C_2H_4$—R—$C(O)OH$, and the ethylene glycol monomer has a chemical formula $C_{2n}H_{4n+2}O_{n+1}$. For example, referring to FIG. 1, the vinyl-terminated fatty acid monomer shown on the left side of the chemical reaction diagram 100 may be mixed with an ethylene glycol monomer (e.g., ethylene glycol or a polyethylene glycol, such as tetraethylene glycol).

The process 300 includes polymerizing the mixture to form a diene, at 304. For example, referring to FIG. 1, the mixture that includes the vinyl-terminated fatty acid monomer and the ethylene glycol monomer shown on the left side of the chemical reaction diagram 100 may be polymerized to form the diene shown on the right side of the chemical reaction diagram 100. As described further herein, material properties of the polymeric phase-change material (e.g., melting temperature, melting enthalpy, etc.) may be "tailored" to a particular thermal management environment (e.g., for electronic device thermal management) by adjusting a first portion of the diene corresponding to the vinyl-terminated fatty acid monomer (represented by the integer x in FIG. 1) and a second portion of the diene corresponding to the ethylene glycol monomer (represented by the integer n in FIG. 1).

The process 300 includes polymerizing the diene to form a polymeric phase-change material, at 306. For example, referring to FIG. 1, the diene shown on the right side of the chemical reaction diagram 100 may be polymerized to form the polymeric phase-change material shown below the diene.

The process 300 includes forming a thermal interface material that includes the polymeric phase-change material, at 308. For example, referring to FIG. 2, the thermal interface material 210 that includes the polymeric phase-change material of FIG. 1 may be formed via application of pressure to the polymeric sheet 202 disposed between the first component 206 (e.g., a heat source, such as a semiconductor die) and the second component 208 (e.g., a heat sink).

Thus, FIG. 3 illustrates an example of a process of forming a thermal interface material that includes a polymeric phase-change material. As described further herein, the thermal interface material having the polymeric phase-change material may provide acceptable material properties at elevated temperatures associated with electronics thermal management.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the scope of the disclosure. Thus, the present disclosure is not intended to be limited to the embodiments shown herein but is to be accorded the widest scope possible consistent with the principles and features as defined by the following claims.

The invention claimed is:

1. A thermal interface material, comprising:
    a polymeric phase-change material, the polymeric phase-change material comprising a block copolymer formed from a diene, the diene formed from a vinyl-terminated fatty acid monomer and an ethylene glycol monomer.

2. The thermal interface material of claim 1, wherein the vinyl-terminated fatty acid monomer has a chemical formula $C_2H_4$—R—C(O)OH and the ethylene glycol monomer has a chemical formula $C_{2n}H_{4n+2}O_{n+1}$, wherein:
    R corresponds to a chain length (x) of at least 8 carbon atoms between a terminal vinyl group and a carbonyl group, and
    n is greater than or equal to 1.

3. The thermal interface material of claim 2, wherein n is equal to 1.

4. The thermal interface material of claim 2, wherein n is 2 or more.

5. The thermal interface material of claim 4, wherein the ethylene glycol monomer includes tetraethylene glycol.

6. The thermal interface material of claim 1, wherein the polymeric phase-change material has a melting transition temperature ($T_m$) in a range of 0° C. to 100° C.

7. The thermal interface material of claim 1, wherein the polymeric phase-change material has a melting enthalpy in a range of 200 J/g to 400 J/g.

8. The thermal interface material of claim 1, wherein the polymeric phase-change material has a thermal stability parameter ($T_d$) of 5% mass loss at a temperature that is in a range of 250° C. to 450° C.

9. The thermal interface material of claim 1, wherein the thermal interface material has a structure represented by:

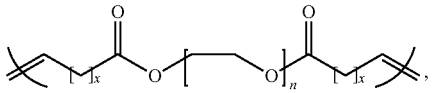

wherein x is at least 8 carbon atoms and n is greater than or equal to 1.

10. A thermal interface material, comprising:
    a polymeric phase-change material, the polymeric phase-change material comprising a block copolymer formed from a diene, the diene being formed from a vinyl-terminated fatty acid monomer and an ethylene glycol monomer, the vinyl-terminated fatty acid monomer having a chemical formula of $C_2H_4$—R—C(O)OH and the ethylene glycol monomer having the chemical formula $C_{2n}H_{4n+2}O_{n+1}$, wherein:
    R corresponds to a chain length (x) of at least 8 carbon atoms between a terminal vinyl group and a carbonyl group, and
    n is greater than 2.

11. The thermal interface material of claim 10, wherein the ethylene glycol monomer includes tetraethylene glycol.

12. The thermal interface material of claim 10, wherein the polymeric phase-change material has a melting transition temperature ($T_m$) in a range of 0° C. to 100° C.

13. The thermal interface material of claim 10, wherein the polymeric phase-change material has a melting enthalpy in a range of 200 J/g to 400 J/g.

14. The thermal interface material of claim 10, wherein the polymeric phase-change material has a thermal stability parameter ($T_d$) of 5% mass loss at a temperature that is in a range of 250° C. to 450° C.

15. The thermal interface material of claim 10, wherein n is equal to 4.

16. The thermal interface material of claim 10, wherein the thermal interface material has a structure represented by:

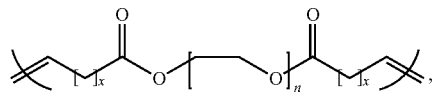

wherein x us at least 8 carbon atoms and n is greater than 2.

17. A thermal interface material, comprising:
    a polymeric phase-change material, the polymeric phase-change material comprising a block copolymer formed from a diene, and the diene being formed from a vinyl-terminated fatty acid monomer and an ethylene glycol monomer, the vinyl-terminated fatty acid monomer having a chemical formula of $C_2H_4$—R—C(O)OH and the ethylene glycol monomer having the chemical formula $C_{2n}H_{4n+2}O_{n+1}$, wherein:
    R corresponds to a chain length (x) of at least 8 carbon atoms between a terminal vinyl group and a carbonyl group,
    n is greater than or equal to 1, and
    the polymeric phase-change material has one or more of a melting transition temperature ($T_m$) in a range of 0° C. to 100° C., a melting enthalpy in a range of 200 J/g to 400 J/g, or a thermal stability parameter ($T_d$) of 5% mass loss at a temperature that is in a range of 250° C. to 450° C.

18. The thermal interface material of claim 17, wherein the thermal interface material has a structure represented by:

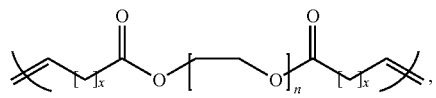

wherein x is at least 8 carbon atoms and n is greater than or equal to 1.

* * * * *